(12) United States Patent
Kim et al.

(10) Patent No.: US 6,936,535 B2
(45) Date of Patent: Aug. 30, 2005

(54) COPPER INTERCONNECT STRUCTURE HAVING STUFFED DIFFUSION BARRIER

(75) Inventors: Ki-Bum Kim, Seongnam-shi (KR); Pekka J. Soininen, Espoo (FI); Ivo Raaijmakers, Bilthoven (NL)

(73) Assignee: ASM International NV, Bilthoven (NL)

( * ) Notice: Subject to any disclaimer, the term of this patent is extended or adjusted under 35 U.S.C. 154(b) by 162 days.

(21) Appl. No.: 10/007,304

(22) Filed: Dec. 5, 2001

(65) Prior Publication Data

US 2002/0187631 A1 Dec. 12, 2002

(30) Foreign Application Priority Data

Dec. 6, 2000 (KR) .................................. 10-2000-74025

(51) Int. Cl.$^7$ ............................. H01L 21/44; H01L 5/12
(52) U.S. Cl. ....................... 438/656; 438/681; 438/683; 438/685; 438/686; 438/688
(58) Field of Search ................. 438/681, 656, 438/683, 685, 686, 688; 427/98, 123

(56) References Cited

U.S. PATENT DOCUMENTS

| | | | |
|---|---|---|---|
| 3,699,734 A | 10/1972 | Jacob et al. ................ | 117/217 |
| 5,019,531 A | 5/1991 | Awaya et al. ............... | 437/180 |
| 5,098,860 A | 3/1992 | Chakravorty et al. ....... | 437/195 |
| 5,252,518 A * | 10/1993 | Sandhu et al. ............. | 438/681 |
| 5,254,498 A * | 10/1993 | Sumi ......................... | 438/653 |
| 5,275,973 A | 1/1994 | Gelatos ...................... | 437/195 |
| 5,391,517 A * | 2/1995 | Gelatos et al. ............. | 438/643 |
| 5,429,989 A * | 7/1995 | Fiordalice et al. .......... | 438/648 |
| 5,592,024 A | 1/1997 | Aoyama et al. ............ | 257/751 |
| 5,674,787 A | 10/1997 | Zhao et al. ................. | 437/230 |
| 5,856,236 A * | 1/1999 | Lai et al. .................... | 438/681 |
| 5,892,254 A | 4/1999 | Park et al. | |
| 5,913,144 A | 6/1999 | Nguyen et al. ............. | 438/643 |

(Continued)

FOREIGN PATENT DOCUMENTS

| | | |
|---|---|---|
| EP | 0 839 927 A2 | 5/1998 |
| JP | 63299250 | 12/1988 |
| JP | 7326612 | 12/1995 |
| JP | 11003890 A | 1/1999 |
| JP | 11111919 | 4/1999 |
| WO | WO 00/75964 A2 | 12/2000 |

OTHER PUBLICATIONS

Abstract of presentation to Korean Materials Academic Society, "Improvement of CVD–TiN diffusion barrier performance in Cu metallization by a thin Al interlayer between Cu and TiN," Apr. 1999, Korea.

Cho, Sung–Lae et al., "Diffusion Barrier Properties of Metalorganic Chemical Vapor Deposited Tantalum Nitride Films Against Cu Metallization," *Journal of the Electrochemical Society*, vol. 146, No. 10, pp. 3724–3730 (1999).

Kim, Byoung–Youp et al., "Microstructure and deposition rate of aluminum thin films from chemical vapor deposition with dimethylethylamine alane," *Appl. Phys. Lett.*, vol. 68, No. 25, pp. 3567–3569 (1996).

(Continued)

*Primary Examiner*—Long Pham
*Assistant Examiner*—Shrinivas Rao
(74) *Attorney, Agent, or Firm*—Knobbe, Martens, Olson & Bear LLP

(57) ABSTRACT

The present invention provides a method of fabricating a semiconductor device, which could advance the commercialization of semiconductor devices with a copper interconnect. In a process of metal interconnect line fabrication, a TiN thin film combined with an Al intermediate layer is used as a diffusion barrier on trench or via walls. For the formation, Al is deposited on the TiN thin film followed by copper filling the trench. Al diffuses to TiN layer and reacts with oxygen or nitrogen, which will stuff grain boundaries efficiently, thereby blocking the diffusion of copper successfully.

19 Claims, 11 Drawing Sheets

U.S. PATENT DOCUMENTS

| | | | | |
|---|---|---|---|---|
| 5,918,150 A | | 6/1999 | Nguyen et al. | 438/687 |
| 5,939,788 A | | 8/1999 | McTeer | 257/751 |
| 5,985,762 A | * | 11/1999 | Geffken et al. | 438/687 |
| 6,008,117 A | * | 12/1999 | Hong et al. | 438/629 |
| 6,025,269 A | | 2/2000 | Sandhu | 438/688 |
| 6,037,257 A | | 3/2000 | Chiang et al. | 438/687 |
| 6,107,687 A | * | 8/2000 | Fukada et al. | 257/762 |
| 6,120,842 A | | 9/2000 | Lu et al. | 427/250 |
| 6,126,806 A | | 10/2000 | Uzoh | |
| 6,127,256 A | * | 10/2000 | Matsuno | 438/624 |
| 6,130,155 A | | 10/2000 | Chen et al. | 438/635 |
| 6,130,160 A | | 10/2000 | Vaartstra | 438/681 |
| 6,160,314 A | * | 12/2000 | Lee et al. | 257/752 |
| 6,160,315 A | * | 12/2000 | Chiang et al. | 257/762 |
| 6,171,898 B1 | | 1/2001 | Crenshaw et al. | 438/240 |
| 6,204,175 B1 | | 3/2001 | Lai et al. | 438/681 |
| 6,204,179 B1 | | 3/2001 | McTeer | 438/687 |
| 6,271,136 B1 | * | 8/2001 | Shue et al. | 438/687 |
| 6,271,592 B1 | | 8/2001 | Kim et al. | |
| 6,342,444 B1 | * | 1/2002 | Higashi et al. | 438/627 |
| 6,380,065 B1 | * | 4/2002 | Komai et al. | 438/622 |
| 6,436,825 B1 | * | 8/2002 | Shue | 438/687 |
| 6,441,492 B1 | * | 8/2002 | Cunningham | 257/762 |
| 6,506,668 B1 | * | 1/2003 | Woo et al. | 438/584 |

OTHER PUBLICATIONS

Kim, Kyoung–Ho et al., abstract of presentation at Advanced Metallization Conference, Oct. 1999, Orlando, FL. "Improvement of diffusion barrier performance by a thin A1 interlayer deposited between barrier and copper. "

Kim, Soo–Hyun et al., "A Comparative Study of Film Properties of Chemical Vapor Deposited TiN Films as Diffusion Barriers for Cu Metallization," *Journal of the Electrochemical Society*, vol. 146, No. 4, pp. 1455–1460 (1999).

Kim, Yu Chang, "Via Poisoning–Free Dual Damascence Etching for Organic Low–k Material Integration," Materials Research Society Symposium Spring 2001, Symposium L., L5.5.

Lee, J. et al., "Influence of Vacuum–Annealing on the Diffusion Barrier Properies of MOCVD TiN for Cu Metallization," *Journal of the Korean Physical Society*, vol. 35, pp. S65–S70 (1999).

Li, Xiaodong et al., "Structural characterization of aluminum films deposited on sputtered–titanium nitride/silicon substrate by metalorganic chemical vapor deposition from dimethylethylamine alane," *Appl. Phys. Lett*, vol. 67, No. 23, pp. 3426–3428 (1995).

Mitsuo, A. et al., "Improvement of high–temperature oxidation resistance of titanium nitride and titanium carbide films by aluminum ion implantation," *Surface and Coatings Technology*, vols. 103–104, pp. 98–103 (1998).

Nam, Ki Tae et al., "Improved diffusion barrier by stuffing the grain boundaries of TiN with a thin Al interlayer for Cu metallization," *Applied Physics Letters*, vol. 79, No. 16, pp. 2549–2551 (2001).

Nam, Ki Tae et al., "Laterally Segregated Two Phase Mixture Diffusion Barrier for Cu Metallization," Presentation at Advanced Metallization Conference, Oct. 2, 2001, Tokyo, Japan, Power Point presentation.

Kim, Kyoung–Ho et al., "A novel scheme of CVD–diffusion barrier for Cu metallization,38 D6.6, p. 95 and and Im, Se–Joon et al., A study on CVD TaN as a diffusion barrier for Cu interconnects," D6.7, pp. 95–96, Presentation at Materials Research Society Symposium—*abstracts attached* , Apr. 2000, San Francisco.

World–Wide web cubic.mat.ncku.edu.tw/ceramics/homepage/intro–e.htm, "Investigation of Diffusion Barrier of TiAIN Films Between Cu and Si (86)," pp. 7–8 and "Diffusion Barrier and Interface Properties of TiAIN Between Cu and Si (89)," p. 10 (Mar. 29, 2001).

Yoon, L. G. et al., "Improvement of Diffusion Barrier Performance of 10nm TiN layer using a very thin A1interlayer," Abstract of presentation at Advanced Metallization Conference, Oct. 2000, San Diego, USA.

Gong et al., "Interdiffusion and reaction in the Cu/TiN/Si thin film system," Applied Surface Science, vol. 92, pp. 335–339, (Dec. 1994).

Rha et al., "Improved TiN film as a diffusion barrier between copper and silicon," Thin Solid Films, vol. 320, pp. 134–140, (May 4, 1998).

* cited by examiner

SAMPLE A : Cu(300nm) / TiN(20nm) / Si
SAMPLE B : Cu(300nm) / Al (5nm) / TiN(20nm) / Si
SAMPLE C : Cu(300nm) / Al (10nm) / TiN(20nm) / Si
SAMPLE D : Cu(300nm) / Al (20nm) / TiN(20nm) / Si

COPPER INTERCONNECT STRUCTURE HAVING STUFFED DIFFUSION BARRIER

REFERENCE TO RELATED APPLICATIONS

The present application claims priority under 35 U.S.C. §119 to Korean Patent Application Number 10-2000-0074025, filed Dec. 6, 2000.

BACKGROUND OF THE INVENTION

1. Field of the Invention

The present invention generally relates to methods of fabricating a semiconductor device and, more particularly, to methods of forming interconnect structures in a semiconductor device fabrication process.

2. Description of the Related Art

A process of fabricating a semiconductor integrated circuit is roughly divided into the process of forming devices on a silicon substrate and the process of electrically connecting the devices. The latter is called an interconnection process or metallization, and is a key for improving yield rate and reliability in the fabrication of semiconductor devices as the devices become more highly integrated.

A metal widely used as an interconnection material is aluminum (Al). However, as the integration of devices is improved, the interconnection line width is reduced, while its total length is increased, such that the signal transfer delay time, represented by the RC time constant, is lengthened. Furthermore, the reduction in interconnection line width results in cutting in the interconnection line due to electromigration or stress migration. Accordingly, in order to fabricate a reliable device with a fast operation speed, copper (Cu) is used instead of aluminum (Al) for forming the interconnection lines since it has lower resistance compared with that of Al and stronger resistance against electromigration and stress migration.

However, Cu lacks excellent properties that Al has other than the low resistance and high melting point. For example, Cu cannot form a dense protective layer such as $Al_2O_3$, has bad adhesive strength to $SiO_2$ and is difficult to dry-etch. In addition, its diffusion coefficient in silicon is approximately $10^6$ times larger than that of Al, and it is known that Cu diffused into the silicon forms a deep level between band gaps. Furthermore, copper's diffusion coefficient in $SiO_2$ is known to be large, which decreases the ability of $SiO_2$ to insulate between Cu lines. As a result of copper's large diffusion coefficient in silicon and $SiO_2$, the reliability of the semiconductor device is reduced. Accordingly, to ensure the reliability of the device, a diffusion barrier capable of preventing Cu from rapidly diffusing into the silicon or $SiO_2$ is required.

Ta or TaN thin films deposited by a sputtering process are currently being used as the diffusion barrier for Cu, instead of the TiN films generally used in the conventional Al interconnection line fabricating process. However, when the diffusion barrier is deposited in a contact or trench structure using sputtering, step coverage deteriorates as the device size becomes smaller. This problem suggests that it would be beneficial to form the diffusion barrier through a more conformal process, such as chemical vapor deposition (CVD).

However, the development of new processes for forming a reliable diffusion barrier for Cu requires a considerably long period of time and this may delay commercialization of a semiconductor device employing a Cu interconnect structure.

The present invention solves the above problems. It is an object of the present invention to provide methods for fabricating a semiconductor device employing a diffusion barrier whose grain boundary is stuffed with metal oxide, not a metal element constructing the diffusion barrier. This may advance commercialization of a semiconductor device with a Cu interconnect structure.

SUMMARY OF THE INVENTION

In accordance with one aspect of the invention, a process for copper metallization is provided. A diffusion barrier comprising grain boundaries is deposited over a semiconductor substrate and a layer of reactive metal is deposited over the diffusion barrier. A different metal compound, such as an oxide or nitride of the reactive metal, is formed in the grain boundaries of the diffusion barrier. Copper is then deposited over the diffusion barrier.

In one embodiment the diffusion barrier is a metal nitride, preferably selected from the group consisting of titanium nitride, tungsten nitride and tantalum nitride. More preferably the diffusion barrier is titanium nitride. In a further embodiment the reactive metal is Al. In another embodiment the different metal compound is formed in the grain boundaries by annealing after deposition of the reactive metal layer.

In another aspect, the present invention provides a process for copper metallization in which a metal nitride layer is deposited on a semiconductor substrate, a layer of reactive metal is deposited over the metal nitride layer, a second metal nitride layer is deposited over the reactive metal layer, and a metal compound is formed from the reactive metal in the grain boundaries of the metal nitride layers. In a preferred embodiment, the metal nitride layers are titanium nitride and the reactive metal is aluminum.

In a further aspect, the present invention provides a diffusion barrier for a copper interconnect comprising a layer of metal nitride covered by a layer of reactive metal. The grain boundaries of the metal nitride layer are stuffed with a different metal compound.

In one embodiment the metal nitride layer is titanium nitride, the reactive metal is aluminum, and the grain boundaries are stuffed with aluminum oxide. In another embodiment the reactive metal is silicon and the grain boundaries of the metal nitride are stuffed with silicon oxide. In yet another embodiment the diffusion barrier additionally comprises a second metal nitride layer over the layer of reactive metal.

BRIEF DESCRIPTION OF THE DRAWINGS

Further objects and advantages of the invention can be more fully understood from the following detailed description taken in conjunction with the accompanying drawings, in which.

DETAILED DESCRIPTION OF THE PREFERRED EMBODIMENTS

Figure 1:
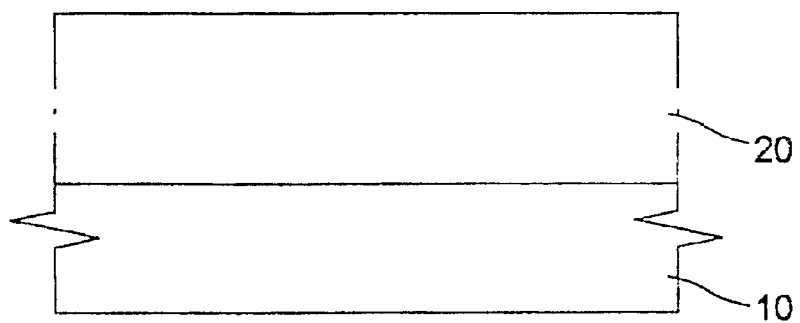
FIGS. 1 to 6 are cross-sectional views showing a method of forming a Cu interconnect structure according to an embodiment of the present invention.

The present disclosure teaches processes for forming a diffusion barrier in the context of copper metallization, as well as diffusion barriers formed by these processes. However, the skilled artisan will appreciate that the present processes and structures have applications in other contexts.

The present invention will now be described in connection with preferred embodiments with reference to the accompanying drawings.

A diffusion barrier is a material that is inserted between two substances in order to prevent the substances from being mixing with each other due to diffusion. In a semiconductor device fabrication process, the diffusion barrier is used not only to prevent the diffusion between a substrate and interconnection material but also to block the interconnection material from diffusing into a dielectric film.

Diffusion barriers can be roughly classified into passive barriers, non-barriers, single crystal barriers, sacrificial barriers and stuffed barriers. If the diffusion barrier remains thermodynamically stable between the interconnection material and substrate, it is a passive barrier or non-barrier. The distinction between the two is based on diffusion through the grain boundary of the diffusion barrier. That is, the diffusion barrier is a passive barrier when it there is little diffusion through the grain boundary. On the other hand, a diffusion barrier is a non-barrier, which does not serve as a diffusion barrier, when material diffuses easily through the grain boundary.

Diffusion barriers are sacrificial barriers if they are thermodynamically unstable such that there is a reaction with either the interconnection material or the substrate. Thus, the sacrificial barrier itself reacts with the interconnection material or substrate material to prevent the diffusion of the material. The sacrificial barrier is consumed according to the reaction so that it loses its function as the diffusion barrier when it has been completely consumed. When a diffusion barrier cannot fulfill its function it is called "diffusion barrier failure". Thus, sacrificial diffusion barrier failure will occur after a lapse of a predetermined time, however it performs its function until then.

Diffusion barrier failure in Cu interconnects is often the result of one of the following three causes:

1) Diffusion of Cu or substrate atoms through defects in the diffusion barrier, such as dislocations or vacancies;
2) Diffusion of Cu or substrate atoms through the grain boundary of a polycrystalline diffusion barrier; and
3) Chemical reaction of the diffusion barrier with the Cu or substrate material.

Failure of a thermodynamically stable diffusion barrier mainly depends on number 2 above, namely, the diffusion of Cu or substrate atoms through the grain boundary of a polycrystalline diffusion barrier. This is because the diffusion of the Cu or substrate atoms through the grain boundary occurs much more readily than diffusion through the grain. Accordingly, it is very important to prevent the diffusion through the grain boundary.

There are several approaches to preventing diffusion through the grain boundary. First, forming the diffusion barrier using a single crystal or amorphous crystal having no grain boundary may avoid grain boundary diffusion. The second approach is to block existing grain boundaries. Blocking the grain boundaries in a polycrystalline thin film is called 'stuffing' and results in a 'stuffed barrier.'

A method of "stuffing" the diffusion barrier that has been studied uses nitrogen stuffing and oxygen stuffing. Precipitates of nitrides or oxides have been formed at the grain boundaries of diffusion barriers by the reaction of nitrogen or oxygen with metal elements present in the diffusion barriers. These precipitates stuff the grain boundaries of the diffusion barriers. In the case of TiN diffusion barriers, commonly used in aluminum metallization, one method to improve the barrier properties is to stuff the grain boundaries with extra oxygen by annealing a TiN thin film deposited by PVD or CVD in a $N_2$ or $O_2$ ambient. For example, diffused oxygen in the grain boundaries of the TiN reacts to form titanium oxide that is thought to stuff the grain boundaries.

The stuffing effect with nitrogen or oxygen works efficiently with Al but is not effective with Cu. Specifically, most of the oxygen introduced into TiN films with the help of annealing diffuses through the grain boundaries of the TiN to oxidize the surface of the TiN grains. The oxygen in the titanium oxide reacts easily with Al that has diffused through the grain boundaries to form $Al_2O_3$. However, in the case of Cu, the enthalpy of formation of copper oxide is smaller than that of Ti oxide. Thus, Cu atoms that diffuse through the grain boundary do not take oxygen from the titanium oxide and do not form copper oxide. The following Table 1 shows the enthalpy of formation of titanium oxide, aluminum oxide and copper oxide.

TABLE 1

| Type | Phase | Enthalpy of formation at 298K (kJ/mol) |
|---|---|---|
| Ti—O | TiO | −519.7 |
|  | $Ti_2O_3$ | −1521.6 |
|  | $Ti_3O_5$ | −2457.2 |
|  | $TiO_2$ | −944.0 |
| Al—O | $Al_2O_3$ | −1675.7 |
| Cu—O | CuO | −168.6 |
|  | $Cu_2O$ | −157.3 |

As described above, a TiN thin film into which oxygen has been incorporated through annealing can serve as an excellent stuffed diffusion barrier for Al but is barely effective for Cu. Furthermore, because Cu is does not react strongly with nitrogen, it is difficult to improve the property of the diffusion barrier by incorporating impurities.

Again, because the enthalpy of formation for copper oxide is smaller than that of Ti oxide, Cu cannot form oxide at the grain boundary of the TiN. The following table 2 shows the tendency of oxide formation enthalpy for various metals.

TABLE 2

|  | Ca | V | Nb | Mo | Hf | Ta | W |
|---|---|---|---|---|---|---|---|
| Enthalpy of oxide formation [kJ/mol] | CaO: −635 | $V_2O_5$: −1550 | $Nb_2O_5$: −1550 | $MoO_3$: −745 | $HfO_2$: −1144 | $Ta_2O_5$: −2045 | $WO_3$: −842 |
|  | Al | Mg | Ti | Zr | Cr | Zn | Be |
| Enthalpy of oxide formation [kJ/mol] | $Al_2O_3$: −1656 | MgO: −601 | $TiO_2$: −944 | $ZrO_2$: −1097 | $Cr_2O_3$: −1139 | ZnO: −350 | BeO: −608 |

As shown in the table 2, metals such as Al, Zr, Cr, V, Nb, Hf and Ta that have an enthalpy of oxide formation larger than that of Ti oxide can form oxides by reacting with oxygen atoms bound to Ti as they diffuse along the TiN grain boundaries. Consequently, these metals can be used to stuff the grain boundary.

A TiN thin film can serve as an effective diffusion barrier in Al interconnection lines because oxygen contained in the TiN thin film can combine with the Al to form an oxide that stuffs the grain boundaries. Thus, a metal whose enthalpy of oxide formation is lower than that of the metal element of the diffusion barrier can be used to "stuff" the grain boundary of the diffusion barrier with the oxide of the metal, thereby forming a diffusion barrier that is effective for Cu interconnection lines. Accordingly, in one embodiment of the present invention a compounding material such as oxygen is incorporated into the diffusion barrier in an amount sufficient for stuffing the grain boundary. In one arrangement, the oxygen is preferably incorporated into the diffusion barrier before the stuffing step. Annealing is preferably carried out to move the material through the grain boundary and to thereby form an oxide at the grain boundary.

In one aspect of the invention, a reactive metal element having a strong inclination to form an oxide is deposited or formed on the diffusion barrier in the form of a thin film, such as by using a gas containing the metal element or a solution including its ions. The diffusion barrier thus contains a small amount of the metal element therein. In the case of the deposition of the metal element, the metal thin film is formed in minimum thickness such that the diffusion of the metal element into the Cu layer is restricted, while the resistance of the Cu layer is not affected.

FIGS. 1 to 6 show an embodiment of a method of fabricating a semiconductor device according to the present invention. FIG. 1 illustrates a part of the semiconductor device, including a substrate 10 and a dielectric film 20 formed thereon. A plurality of elements may be formed on the semiconductor substrate 10, such as MOS transistors, bipolar junction transistors and resistors, for example. These elements have been formed previously through fabrication processes executed before the illustrated step. The semiconductor device shown may employ a multilevel-interconnection structure. In this case, the substrate 10 can include the semiconductor elements and a metal layer that electrically connects the elements. A dielectric film 20 may be, for example, $SiO_2$, $Si_3N_4$, or a doped glass film. It is preferably formed through CVD or PECVD processes, depending on its composition. In a preferred embodiment, the dielectric film 20 is preferably formed of $SiO_2$ deposited by CVD.

Figure 2:
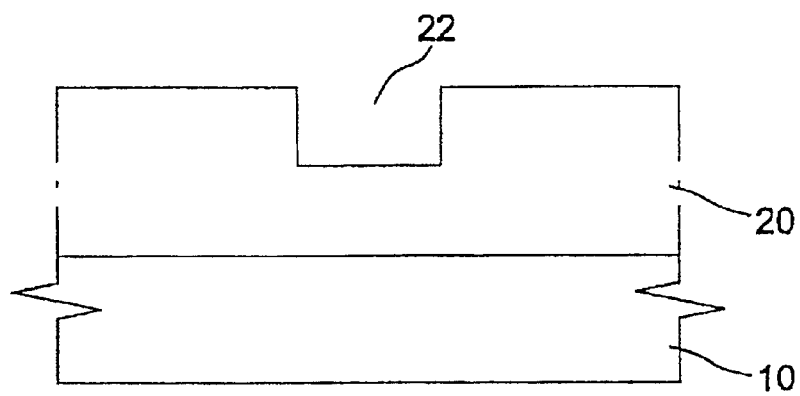

Next, as shown in FIG. 2, a via or trench 22 is formed in the dielectric film. The via or trench 22 may be formed using reactive ion etching and a mask that defines the boundary of the via or trench 22. In case of a contact hole through which a metal line comes into contact with an element formed on the substrate or a lower metal line, the via penetrates the dielectric film 20 to reach the substrate 10. In a field region other than a contact hole, however, it does not reach the substrate 10 and instead forms a trench 22 in which a metal line is to be formed. FIGS. 1 to 6 show the trench 22 formed at the field region. The skilled artisan will recognize this as a stage in damascene metallization.

Figure 3:
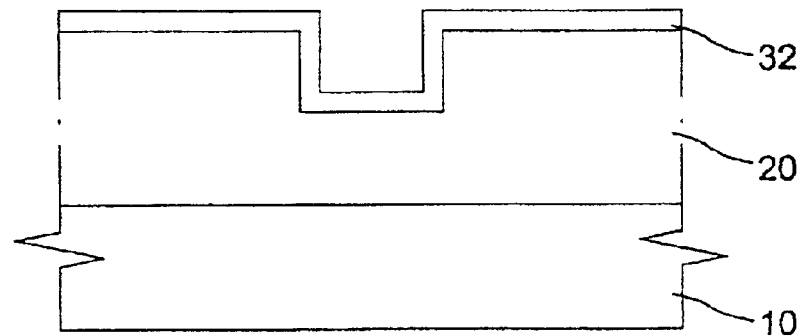

Referring to FIG. 3, a TiN thin film 32 is deposited by CVD on the dielectric film 20 having the trench 22 formed therein. The TiN thin film 32 is preferably formed to a thickness of approximately 100 Å. Thereafter, a process for incorporating a compounding material, such as oxygen or nitrogen, into the grain boundaries of the TiN thin film 32 is executed. Preferably, oxygen is incorporated into the grain boundary. This may be accomplished by exposing the TiN thin film 32 to the air, by annealing the TiN film in a furnace or by treating the TiN thin film with activated oxygen from an $O_2$-plasma.

Figure 4:
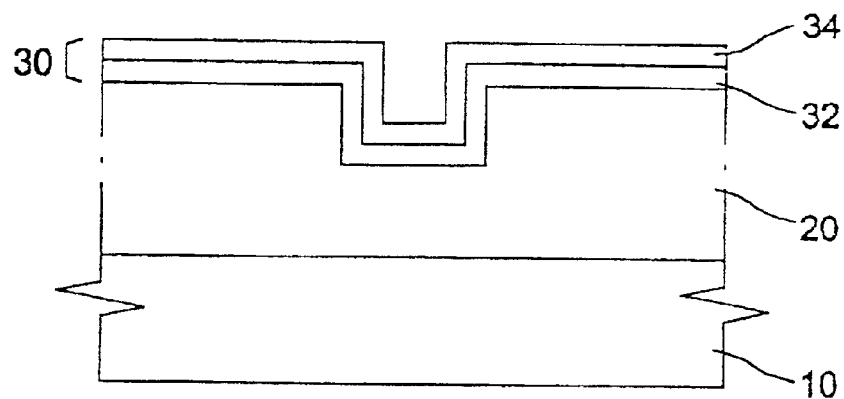

Referring to FIG. 4, an Al thin film 34 serving as an intermediate metal layer is deposited on the TiN film 32, such as by CVD. In a preferred embodiment, the Al thin film 34 is formed to a thickness of about 0.1–2.0 nm. The double layer 30 of the TiN thin film 32 and Al thin film 34 serves as a new diffusion barrier after an annealing process.

Figure 5:
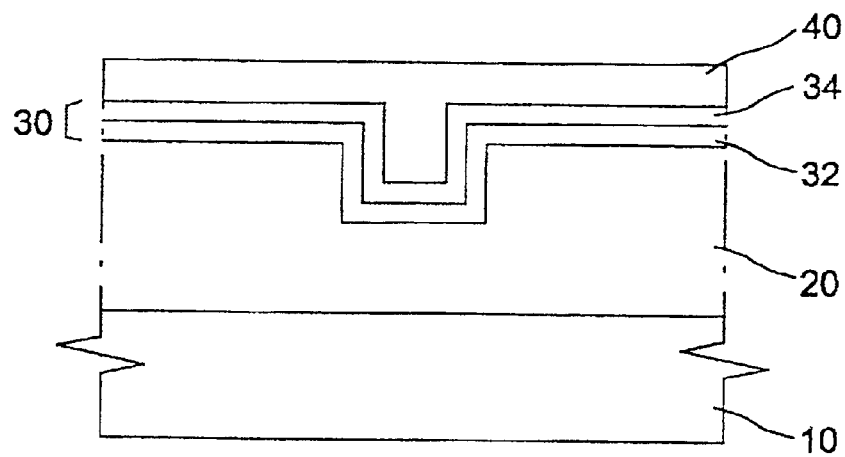
Figure 6:
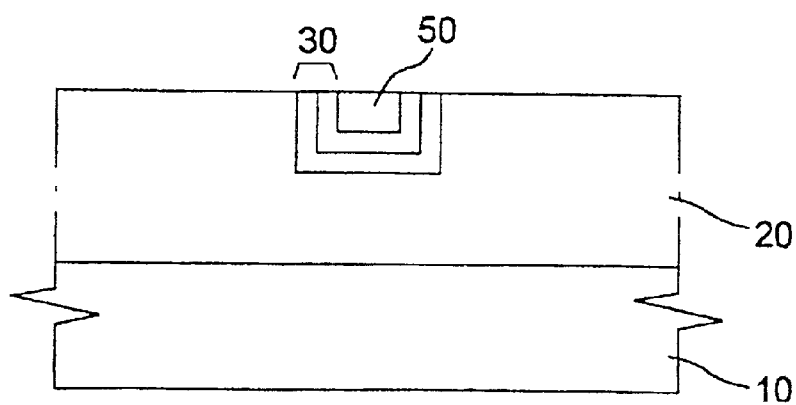

Referring to FIG. 5, a Cu layer 40 is deposited on the double layer 30 to fill the trench 22. The Cu layer 40 is preferably formed through PVD, electroplating or MOCVD. After the completion of the deposition of the Cu layer, the surface of the semiconductor device is planarized as shown in FIG. 6. In a preferred embodiment, the planarization is carried out in such a manner that the TiN thin film 32, Al thin film 34 and Cu layer 40 are nonselectively removed through chemical mechanical polishing (CMP). Note that CMP could be selective against a CMP shield over the insulating layer 20. In another alternative embodiment, the planarization may be performed by a nonselective plasma etching process. Upon completion of the planarization, a Cu interconnect 50 is exposed and the diffusion barrier 30, comprising the TiN thin film 32 and Al thin film 34, is present between the dielectric film 20 and the Cu interconnect 50. In the aforementioned process, an annealing process is performed at least once following deposition of the Al film.

Figure 8:
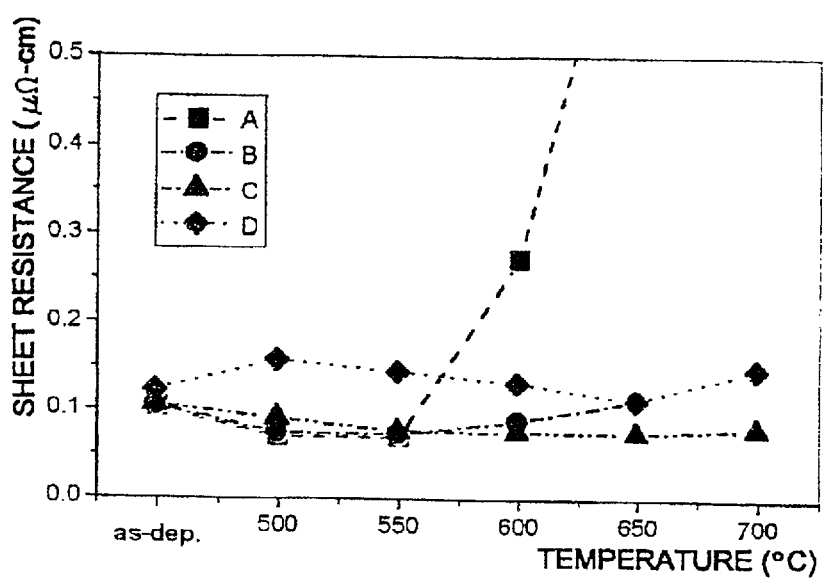
FIG. 8 is a graph showing the sheet resistances of samples based on the thickness of the Al thin film and the annealing temperature in experimental Cu interconnect structures, comparing a conventional structure with structures formed according to one embodiment of the present invention.
Figure 9A:
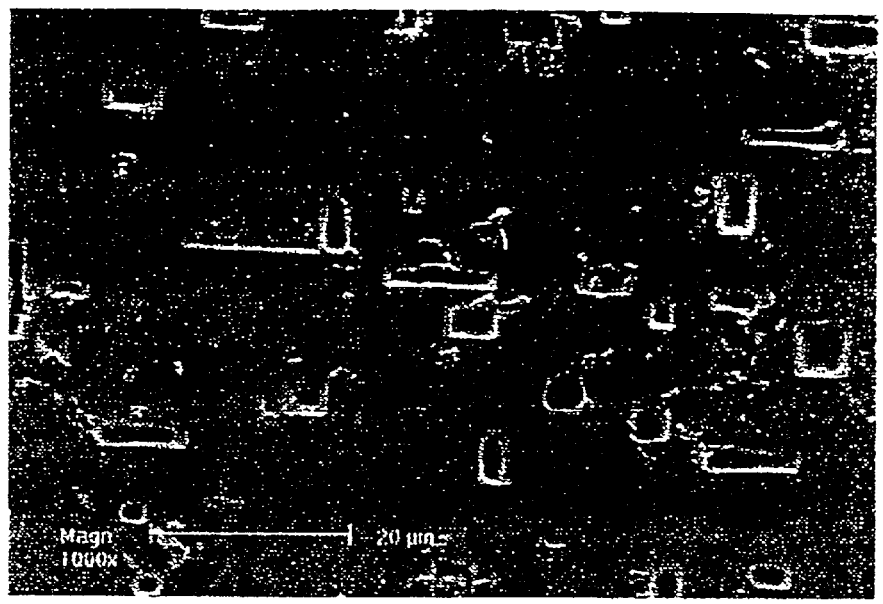
FIGS. 9A to 9D are SEM photographs showing etch pits on a silicon surface exposed after etching Cu, Al and TiN layers in experimental Cu interconnect structures, comparing a conventional structure with structures formed according to one embodiment of the present invention.
Figure 9B:
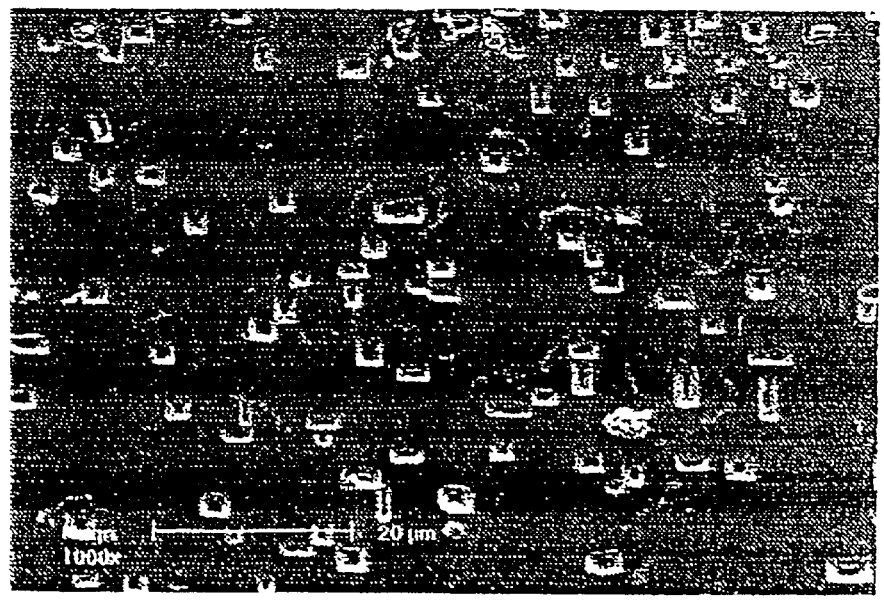
Figure 9C:
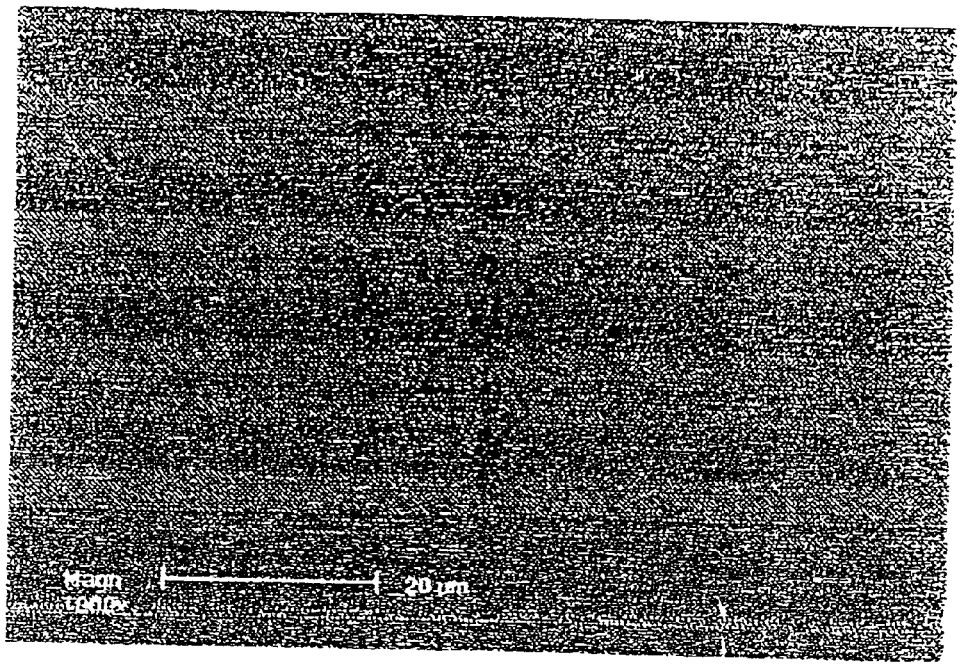
Figure 9D:
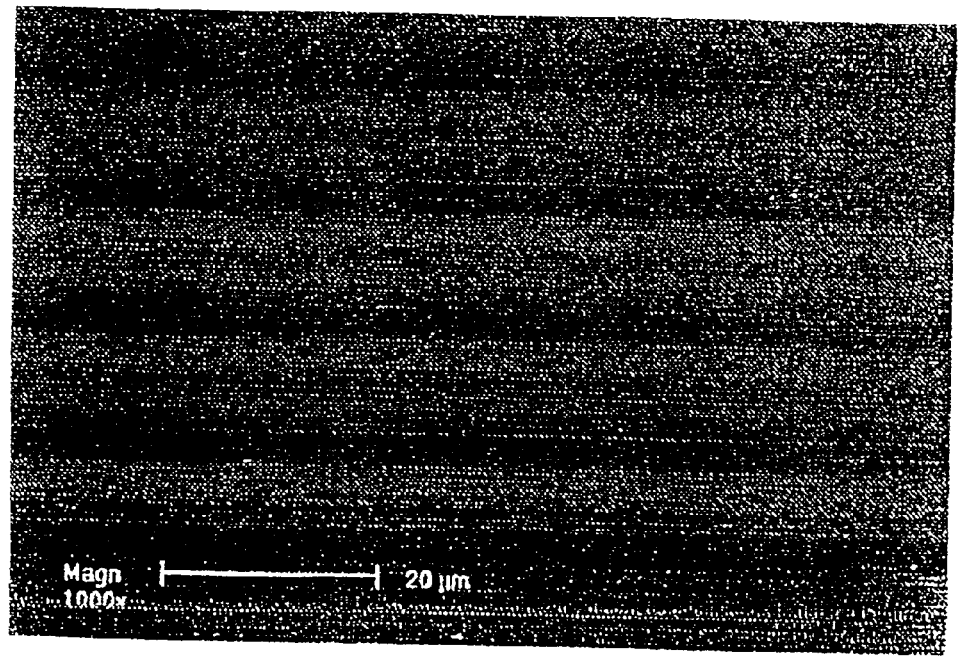

FIGS. 8 and 9 illustrate experimental examples of Cu interconnect structures realized according to one embodiment of the present invention. In the examples shown, a TiN layer was deposited to the thickness of about 200 Å by pyrolytic deposition using the single precursor of TDMAT on an 8-inch silicon wafer. The wafer was cut into samples with a size of 1 $inch^2$ and Al and Cu were continuously deposited thereon using DC magnetron sputtering. Annealing was carried out at a pressure of below $5 \times 10^6$ Torr in a vacuum ambient. The annealing was carried out for one hour at temperatures from about 500–700° C., with the temperature being increased in steps of about 50° C. The sheet resistance of each of the annealed samples was measured by using a four-point probe. FIG. 8 shows the measured result of the sheet resistance based on various thicknesses of the Al thin film and different annealing temperatures. As shown in FIG. 8, the samples having the Al thin film deposited thereon at a thickness of 10 nm or greater effectively block diffusion of Cu, compared to sample A, having only Cu deposited thereon.

The Cu layer, Al film and TiN film were removed using a chemical solution in order to estimate the diffusion barrier failure temperature, and then the silicon surface was Secco-etched. FIGS. 9A to 9D are SEM (Scanning Electron Microscopy) photographs of etch pits on the silicon surface exposed by the etching. FIGS. 9A to 9D correspond to the four samples (A, B, C and D) of FIG. 8, respectively, which were all annealed at 650° C. As shown in FIGS. 9A to 9D, the size and density of the etch pits are sharply reduced as the Al film thickness increases.

As a result of the estimation of the failure temperature, diffusion barrier failure occurred in the sample having only the Cu layer deposited thereon, without the Al film, after annealing for one hour at 500° C. under vacuum. Diffusion barrier failure did not occur in the samples with an Al film of 10 nm or greater thickness or more deposited thereon, even after annealing for one hour at 700° C. in the same ambient. From this result, it is understood that the CVD-TiN thin film deposited contains greater than 20 atomic % oxygen because its fine structure is porous enough that Al in contact with the TiN film diffuses into the TiN grain boundaries during the annealing to form Al oxide at the grain boundaries, thereby blocking Cu diffusion.

Figure 7:
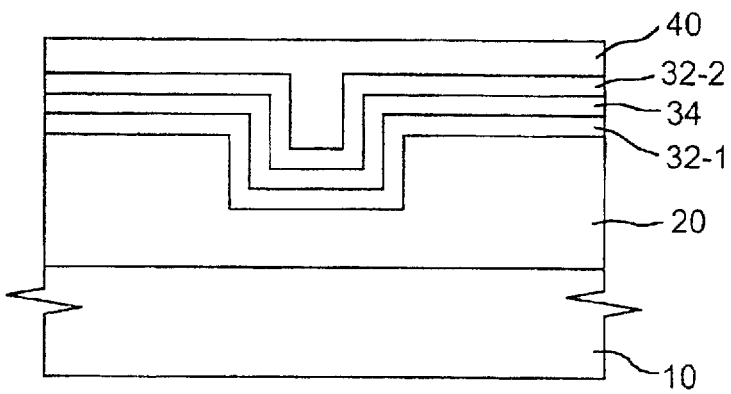
FIG. 7 is a cross-sectional view of a Cu interconnect structure according to another embodiment of the present invention.

Although a specific embodiment has been illustrated and described above, it will be obvious to those skilled in the art that various modifications may be made. For example, although the Al thin film is formed as the intermediate metal layer on the single-level TiN diffusion barrier 32 in the above-described embodiment, the TiN diffusion barrier can be formed in a multilevel structure. In the case of a multilevel TiN diffusion barrier, the Al film is formed between the layers of the multilevel TiN diffusion barrier. FIG. 7 shows the case where the TiN diffusion barrier is formed of two layers. Referring to FIG. 7, a first TiN thin film 32-1 is deposited on the dielectric film 20, preferably using CVD, and then the process for stuffing the grain boundary thereof with oxygen is carried out. Thereafter, Al is deposited on the first TiN thin film 32-1. As described above, the intermediate Al metal layer is preferably deposited in the form of thin film on the first TiN film 32-1, or an adhesion layer is formed on the TiN film using a gas containing Al or a solution having Al ions.

Subsequently, a second TiN thin film 32-2 is deposited on the intermediate metal layer using CVD, thereby forming a multilevel TiN diffusion barrier. The Cu layer 40 is deposited on the second TiN film 32-2 through the aforementioned process. After the deposition of the second TiN thin film 32-2, annealing is preferably carried out for the deposited structure at least once. With the structure shown in FIG. 7, Al diffuses into the first and second TiN thin films 32-1, 32-2 during the annealing and combines with $O_2$ existing in the films to form Al oxide at the grain boundaries of the first and second TiN thin films 32-1, 32-2, thereby effectively blocking the diffusion of Cu. In addition, a further intermediate metal layer can be formed on the second TiN thin film 32-2 to block the diffusion of Cu more effectively.

Although Al is used for the intermediate metal layer in the above illustrated embodiment of the invention, Zr, Cr, V, Nb, Hf or Ta, which have a stronger inclination to formation oxide than Ti, can also be used as a material for forming the intermediate metal layer as shown in Table 2. In other words, the intermediate metal layer is formed of a metal element that forms an oxide thereof more easily than the metal element of which the diffusion barrier is comprised.

Furthermore, the intermediate metal layer can be formed through a method other than CVD, such as PVD, electroplating, electrodeless plating, wet chemical contamination and atomic layer deposition (ALD).

Although the diffusion barrier is formed of TiN in the aforementioned embodiment, TaN or WN can be also used for the diffusion barrier and deposited using CVD. In addition, the above-described embodiment relates to the fabrication of a Cu interconnect structure located on the dielectric film. However, in the actual semiconductor device fabrication process, a contact hole for connecting the metal line for interconnection to an element formed on the substrate or a lower metal line can be formed. In the structure having this contact hole, the diffusion barrier is deposited on the substrate or lower metal line located under the contact hole, the intermediate metal layer is formed on the diffusion barrier and the Cu layer is deposited on the intermediate metal layer. In a further variation of this embodiment of the invention, the Cu layer is not deposited in the contact hole, ohmic contact is made using only the intermediate metal layer, and the Cu interconnect structure is employed only in the field area.

As described above, a novel diffusion barrier combines a layer comprising a diffusion barrier layer used in the conventional Al interconnect structure, for example, a TiN film, with an intermediate metal ultra thin film, preferably comprised of a metal selected from the group consisting of Al, Zr, Cr, V Nb, Hf and Ta. By forming the diffusion barrier for the copper line in an easier way, the commercialization of copper as the line material can be advanced.

In another embodiment, a diffusion barrier comprising grain boundaries is deposited on a semiconductor substrate. Preferably the diffusion barrier comprises a metal nitride, such as titanium nitride, tungsten nitride or tantalum nitride. More preferably the diffusion barrier is titanium nitride. A thin layer of a reactive metal is deposited on the diffusion barrier layer. The reactive metal reacts with a compounding material, particularly nitrogen or oxygen, to form a different metal compound that expands within and stuffs the grain boundaries of the metal nitride layer. Preferably the reactive metal reacts with oxygen to form a metal oxide during an annealing process. The oxygen may have been incorporated in the metal nitride layer prior to deposition of the reactive metal layer. Alternatively the oxygen may be supplied during the annealing.

In a further embodiment, a diffusion barrier comprising grain boundaries is deposited on a semiconductor substrate. Preferably the diffusion barrier comprises a metal nitride, such as titanium nitride, tungsten nitride or tantalum nitride. More preferably the diffusion barrier is titanium nitride. A thin layer of a reactive metal is deposited on the diffusion barrier layer. A second layer of metal nitride is then deposited on top of the reactive metal layer, to form a laminate structure.

Figure 10:
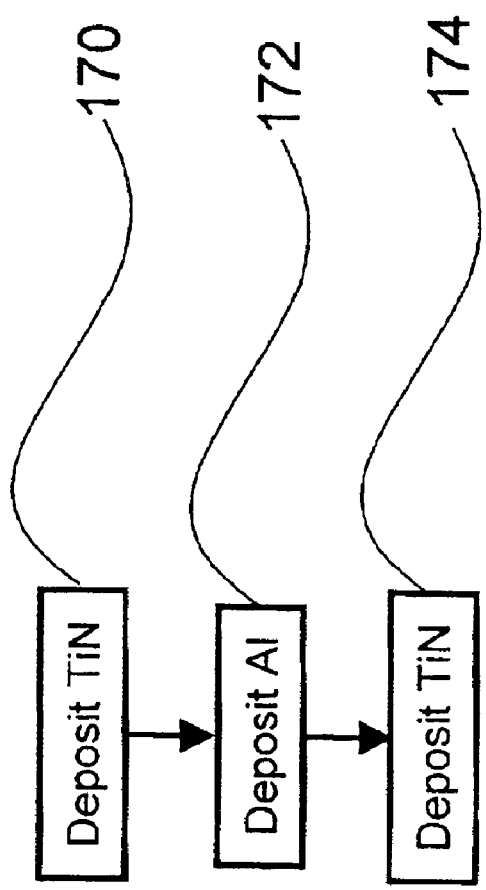
FIG. 10 illustrates a process for the growth of TiN/Al/TiN by ALD.

FIG. 10 illustrates a process for depositing a TiN/Al/TiN structure. A 5 nm layer of TiN is grown 170 by ALD on a semiconductor substrate. Next, a 2 nm aluminum layer is grown 172 by ALD on the TiN layer. Finally a 5 nm layer of TiN is grown 174 by ALD on the aluminum layer.

In yet a further embodiment an additional metal layer is deposited. Thus, a diffusion barrier comprising grain boundaries is deposited on a semiconductor substrate. The diffusion barrier is preferably a metal nitride, such as TiN. A first reactive metal layer, such as an aluminum layer, is deposited thereon. Next, a second metal layer is deposited on the first reactive metal layer. A second diffusion barrier, such as a metal nitride layer, is then deposited on the second metal layer. According to one embodiment the second metal layer is a titanium metal layer that covers the surface of the first reactive metal and protects it against the nitrogen source chemical that is used for the growth of a second diffusion barrier layer, such as a metal nitride layer. A process for producing structures according to this embodiment is diagramed in FIG. 11.

Figure 11:
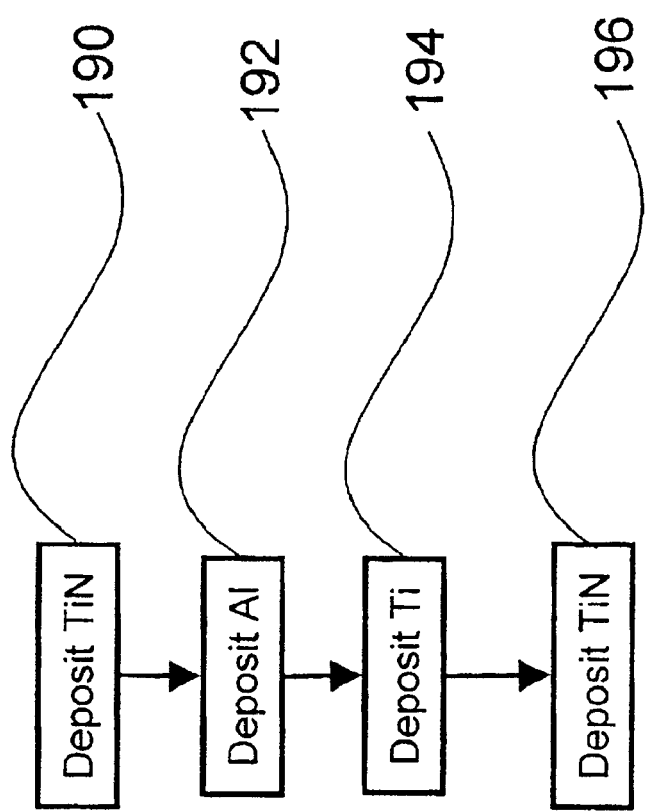
FIG. 11 shows a process for the growth of TiN/Al/Ti/TiN by ALD.

As shown in FIG. 11, a 5-nm layer of TiN is grown 190 by, e.g., ALD on a substrate surface. Next, a 2-nm aluminum layer is grown 192 by, e.g., ALD on the TiN surface. Then a 1-nm layer of Ti is grown 194 by, e.g., ALD on the aluminum surface. The Ti layer protects the aluminum layer against the nitrogen source chemical that is used to grow the second metal nitride layer. Finally, a 4-nm layer of TiN is grown 196 by, e.g., ALD on the titanium surface. Because ALD often utilizes highly reactive source chemicals, in the beginning of the TiN layer growth 196, the nitrogen source chemical might react with the titanium metal (deposited at step 194) and convert the titanium metal into titanium nitride. In that case the resulting thin film structure would be TiN/Al/TiN, instead of TiN/Al/Ti/TiN.

In each of the embodiments described above, the diffusion barrier comprising grain boundaries may be treated with oxygen or nitrogen, for compounding with the reactive metal in the grain boundaries, prior to deposition of the reactive metal layer. Such treatment may comprise, for example, exposure to oxygen in the atmosphere, an oxygen anneal process or treatment with $O_2$ plasma. As a result, oxygen or nitrogen is incorporated in the grain boundaries of the diffusion barrier. The compounding material may be present in an unreacted form, such as free oxygen or nitrogen, and/or may have previously reacted with the metal of the diffusion barrier at the grain boundaries forming, e.g., $TiO_2$. At any point following deposition of the reactive metal layer, an anneal step is carried out such that the reactive metal reacts with the oxygen or nitrogen present in the grain boundaries of the metal nitride layer to form an oxide or nitride stuffing the grain boundaries. This metal oxide or nitride incorporates the reactive metal, which is different from the metal in the metal nitride.

Alternatively, an anneal process is carried out in the presence of oxygen after deposition of the reactive metal layer. In the case of the laminate embodiments, the oxygen anneal may be carried out immediately following deposition of the first reactive metal layer, or after the deposition of a subsequent reactive metal and/or further metal nitride layer. The reactive metal layer reacts with oxygen during the oxygen anneal to form a metal oxide that stuffs the grain boundaries of the diffusion barrier.

The term "reactive metal" or "elemental metal" as used herein, broadly refers to any element that can react with oxygen to form an oxide or nitrogen to form a nitride and stuff the grain boundaries of a diffusion barrier layer, particularly a metal nitride layer. Reactive metals include, but are not limited to, aluminum, silicon, titanium, metals in groups IVB, VB and VIB of the periodic table, such as Zr, Hf, V, Nb, Ta, Cr, Mo and W, germanium, magnesium, yttrium, lanthanum, and metals in Group III of the periodic table, including the lanthanide series (e.g., Sc, Ce, pr, Nd, Sm, Eu, Gd, Tb, Dy, Ho, Er, Tm, Yb and Lu).

Metal nitride layers, for example TiN layers, may be formed by any method known in the art, including PVD, CVD, ALD and PEALD. Preferably, damascene trenches and/or contact vias are lined with metal nitride by ALD for forming conformal layers.

Figure 12:
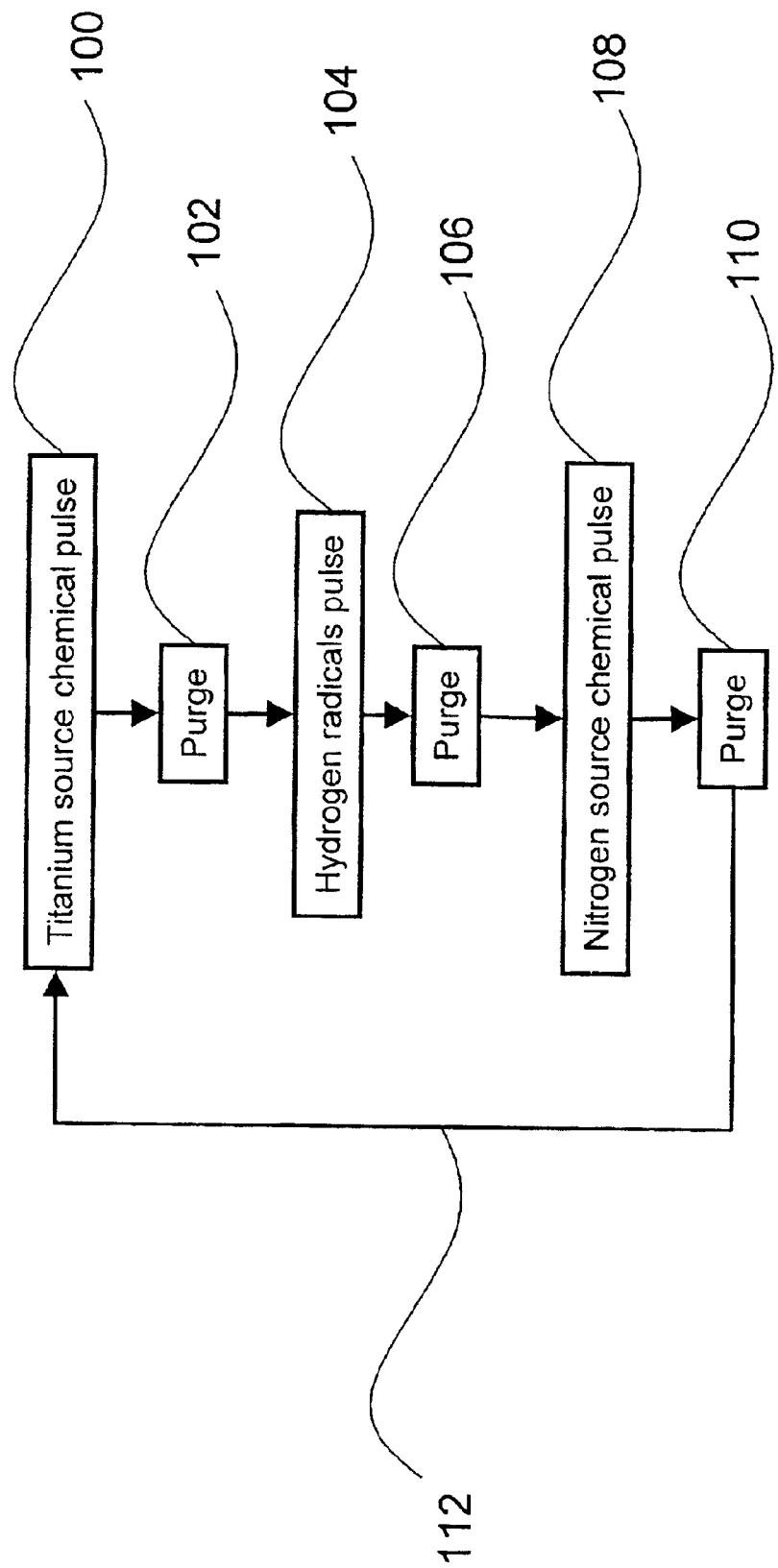
FIG. 12 illustrates a process for the growth of TiN by atomic layer deposition (ALD) using plasma.

In one embodiment a TiN layer is preferably formed by atomic layer deposition (ALD), more preferably by plasma enhanced atomic layer deposition (PEALD). FIG. 12 is a flowchart illustrating an exemplary PEALD process for depositing a TiN layer. A titanium source chemical is pulsed 100 to the reaction chamber. Titanium source chemical molecules adsorb on the substrate surface, self-limitingly, to form no more than a monolayer. Surplus titanium source chemical molecules and possible reaction byproducts are purged away 102. Hydrogen radicals are formed and contacted with the substrate surface for a pulse time 104. The adsorbed titanium source chemical molecules are reduced into elemental titanium metal atoms by the hydrogen radicals. Excess hydrogen radicals and reaction byproducts are purged away 106. A nitrogen source chemical is pulsed into the reaction chamber 108. Excess nitrogen source chemical molecules are purged away 110 and the cycle 112 is repeated until a layer of TiN with the desired thickness is grown. A typical thickness for the TiN layer is 5 nm to 10 nm.

Figure 13:
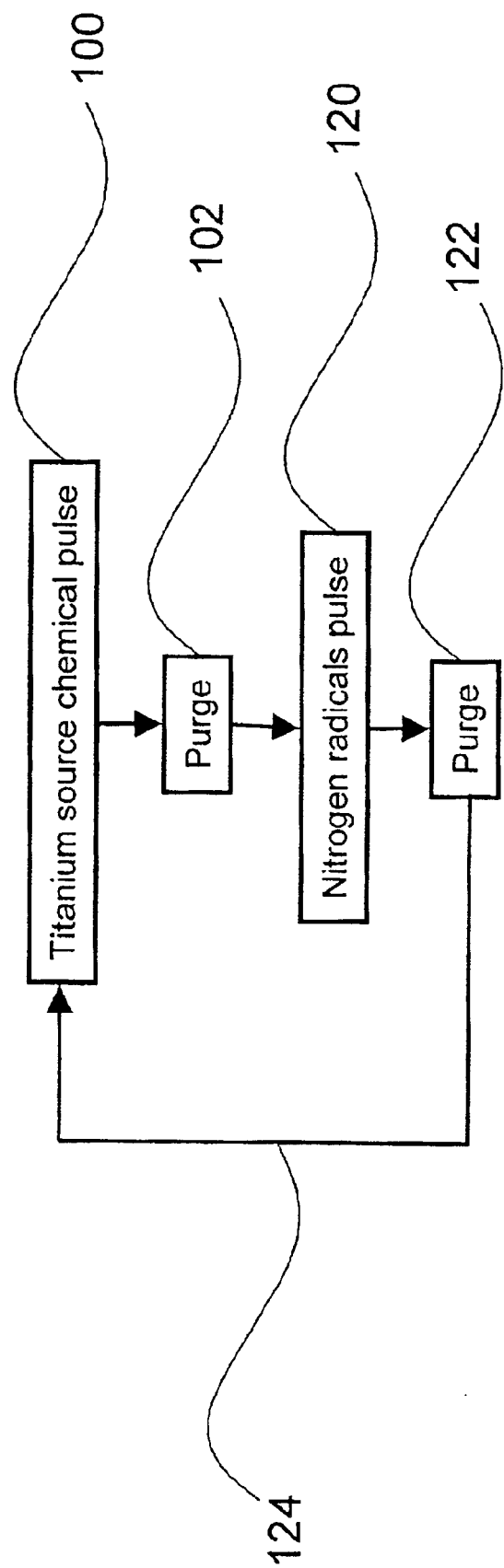
FIG. 13 illustrates a process for the growth of TiN by plasma enhanced ALD (PEALD) using nitrogen radicals.

FIG. 13 illustrates another possible process for depositing a TiN layer by PEALD. A titanium source chemical is pulsed 100 to the reaction chamber. Titanium source chemical molecules adsorb on the substrate surface, self-limitingly, to form no more than a monolayer. Surplus titanium source chemical molecules and possible reaction byproducts are purged away 102. Nitrogen radicals are formed and contacted with the substrate surface for a pulse time 120. Several exemplary nitrogen source chemicals that may be used in forming metal nitrides include radicals of N, NH and $NH_2$ as well as excited $N_2^*$. The adsorbed titanium source chemical molecules react with nitrogen radicals and form titanium nitride on the surface. Excess hydrogen radicals and reaction byproducts are purged away 122. The cycle 124 is repeated until a layer of TiN of the desired thickness is grown. A typical thickness for the TiN layer is 5–10 nm.

The reactive metal layer may also be deposited by any method known in the art, such as by PVD, CVD, ALD or plasma enhanced ALD (PEALD) processes. In one embodiment the metal layer is deposited by ALD. Source chemicals for use in ALD of the reactive metal layer include, for example, alanes, alkyl aluminum, silanes, germanes, alkylamido titanium compounds such as tetrakis (ethylmethylamido) titanium, and cyclopentadienyl metal compounds.

In the case of a thin film of a very reactive metal, such as aluminum, an ALD process preferably utilizes pulsed plasma and inactive purging and carrier gases. Inactive gases are preferably selected from the group consisting of argon (Ar), helium (He), hydrogen ($H_2$) and mixtures thereof.

Figure 14:
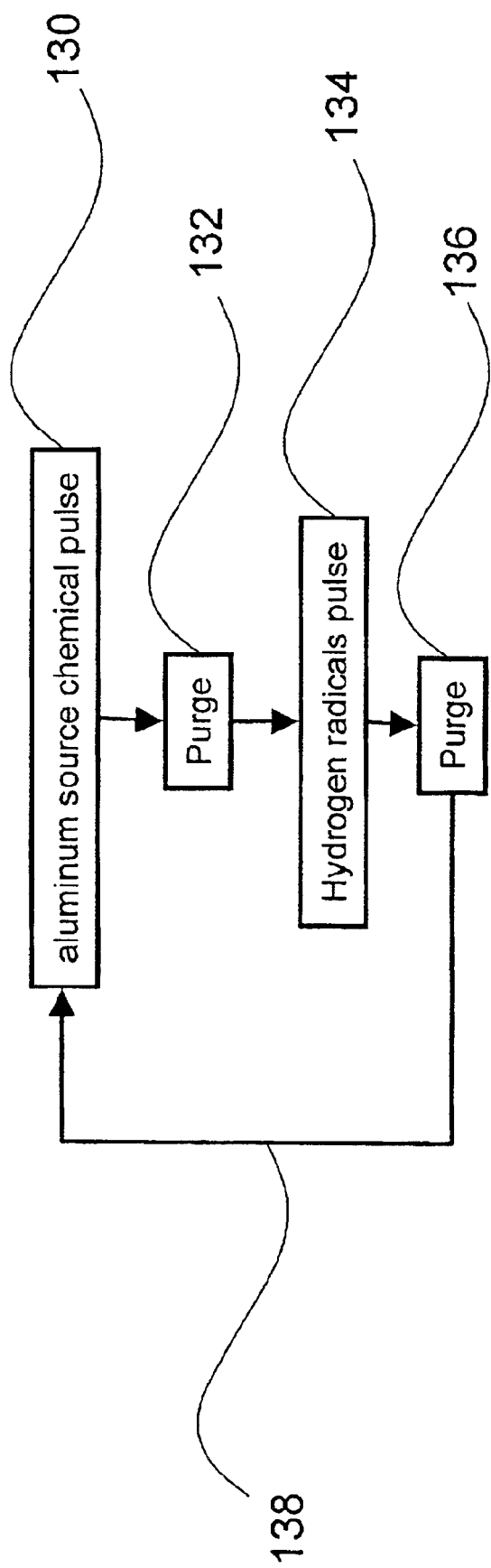
FIG. 14 shows a process for the growth of elemental aluminum using hydrogen radicals.

For example, in one embodiment a layer of elemental aluminum is deposited by PEALD as outlined in FIG. 14. An aluminum source chemical is pulsed 130 into the reaction chamber. Exemplary ALD source chemicals for the deposition of aluminum include alanes and alkyl aluminum (e.g., trimethyl aluminum). A preferred aluminum source chemical is dimethylethylamine alane (DMEAA), which lacks aluminum-carbon bonds and is therefore less likely to lead to carbon contamination of the aluminum layer. When DMEAA is used, the temperature is preferably kept below the thermal decomposition limit, normally less than about 120° C., more preferably less than about 100° C., and above the condensation limit. Aluminum source chemical molecules adsorb on the substrate surface. Excess aluminum source-chemical molecules and possible reaction byproducts are purged away 132. Hydrogen radicals are formed and contacted with the substrate surface for a pulse time 134. The adsorbed aluminum source chemical molecules react with hydrogen radicals and form elemental aluminum atoms on the substrate surface. Excess hydrogen radicals and reaction byproducts are purged away 136 and the cycle 138 is repeated until a layer of elemental aluminum of the desired thickness is grown. A typical thickness for an aluminum metal layer is 2 nm.

In another embodiment a layer of elemental aluminum is deposited by CVD. Deposition of an aluminum layer by CVD is described, for example, in Kim et al. ("Microstructure and deposition rate of aluminum thin films from chemical vapor deposition with dimethylethylamine alane," Appl. Phys. Lett. 68 (25): 3567–3569 (1996)) and in Li et al. ("Structural characterization of aluminum films deposited on sputtered-titanium nitride/silicon substrate by metalorganic chemical vapor deposition from dimethyethylamine alane," Appl. Phys. Lett. 67(23): 3426–3428 (1995)), both of which are hereby incorporated by reference. In both processes, a preferred aluminum source chemical is DMEAA.

Figure 15:
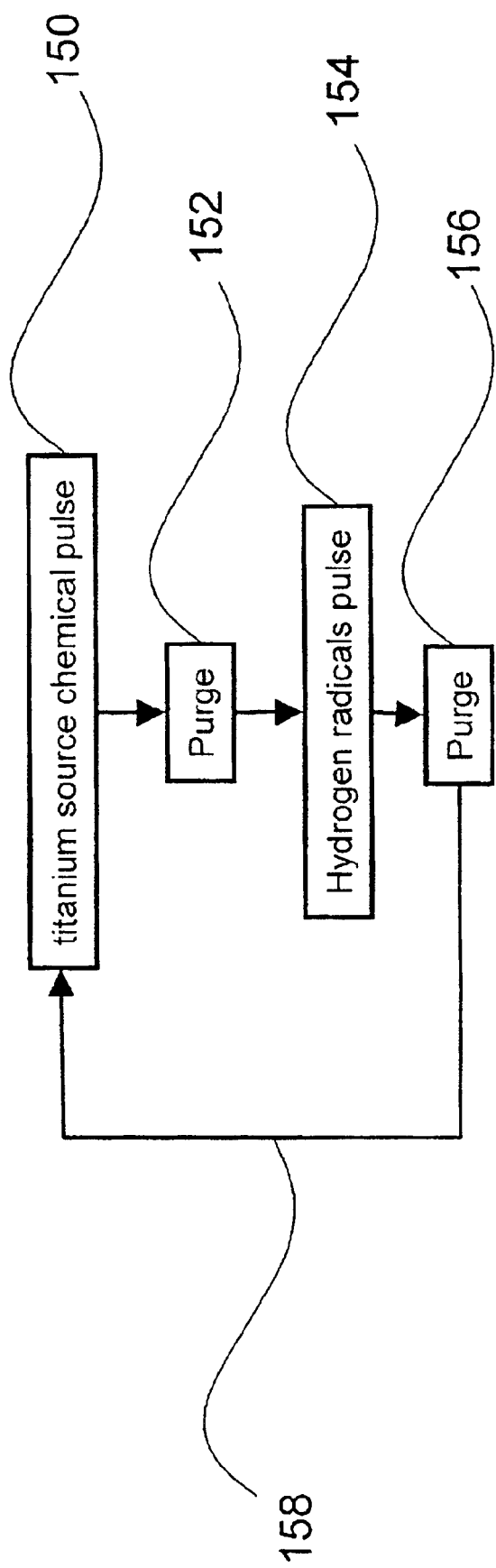
FIG. 15 is a process for the ALD growth of elemental titanium with hydrogen radicals.

A layer of elemental titanium can also be deposited by ALD, as illustrated in FIG. 15. A titanium source chemical is pulsed 150 into the reaction chamber. Titanium source chemical molecules adsorb on the substrate surface, self-limitingly, leaving no more than a monolayer. Excess titanium source-chemical molecules and possible reaction byproducts are purged away 152. Hydrogen radicals are formed and contacted with the substrate surface for a pulse time 154. The adsorbed titanium source chemical molecules react with hydrogen radicals and form elemental titanium atoms on the substrate surface. Excess hydrogen radicals and reaction byproducts are purged away 156. The cycle 158 is repeated until a layer of elemental titanium is grown. A typical thickness for the titanium metal layer is 0.5–2 nm.

In yet another embodiment a stuffed diffusion barrier is formed by depositing a first TiN layer by ALD, depositing an aluminum layer by ALD or CVD on the first TiN layer and depositing a second TiN layer by ALD on the aluminum layer. The structure is annealed in the presence of oxygen, either after depositing the aluminum layer or after depositing the second TiN layer. The aluminum reacts with oxygen during the oxygen anneal to form $Al_2O_3$ that stuffs the nitride grain boundaries of one or both TiN layers.

In a further embodiment a stuffed diffusion barrier is formed by depositing a layer of TiN, depositing a layer of silicon thereon, depositing an optional further TiN layer thereover, and annealing such that the silicon reacts with oxygen to form silicon oxide that stuffs the grain boundaries of the TiN layer.

Although the foregoing invention has been described in terms of certain preferred embodiments, other embodiments will be apparent to those of ordinary skill in the art, in view of the disclosure herein. Accordingly, the present invention is not intended to be limited by the recitation of the preferred embodiments, but is instead to be defined by reference to the appended claims.

We claim:

1. A diffusion barrier for a copper interconnect comprising a first layer of metal nitride directly contacting and covered by a layer of reactive metal, and a second layer of metal nitride directly contacting and over the layer of reactive metal, wherein the grain boundaries of the first and second metal nitride layers are stuffed with a metal compound of the reactive metal, wherein the reactive metal is a different metal from each metal in the metal nitride layers and is selected from the group consisting of Al, Si, Ti, Zr, Hf, V, Nb, Ta, Cr, Mo, W, Mg, Y and La, and wherein the diffusion barrier directly underlies a copper layer of the copper interconnect.

2. The diffusion barrier of claim 1, wherein the metal nitride of the first metal nitride layer is selected from the group consisting of titanium nitride, tungsten nitride and tantalum nitride.

3. The diffusion barrier of claim 2, wherein the metal nitride of the first metal nitride layer is titanium nitride.

4. The diffusion barrier of claim 1, wherein the reactive metal is Al.

5. The diffusion barrier of claim 1, wherein the reactive metal is Si.

6. The diffusion barrier of claim 1, wherein the metal compound is an oxide of the reactive metal.

7. The diffusion barrier of claim 6, wherein the metal compound is selected from the group consisting of aluminum oxide and silicon oxide.

8. The diffusion barrier of claim 1, wherein the metal compound is a nitride of the reactive metal.

9. The diffusion barrier of claim 8, wherein the metal compound is selected from the group consisting of aluminum nitride and silicon nitride.

10. The diffusion barrier of claim 1, wherein the first metal nitride layer is about 5 to 10 nm thick.

11. The diffusion barrier of claim 1, wherein the reactive metal layer is about 2 nm thick.

12. The diffusion barrier of claim 1, wherein the reactive metal is a lanthanide.

13. A diffusion barrier for a copper interconnect comprising:

a first layer of metal nitride;

a layer of reactive metal directly contacting and over the first layer of metal nitride wherein the reactive metal is selected from the group consisting of metals of group IIIB of the periodic table, metals of group IVB of the periodic table, metals of group VB of the periodic table and metals of group VIB of the periodic table; and a second layer of metal nitride directly contacting and over the layer of reactive metal, wherein the grain boundaries of the first and second metal nitride layers are stuffed with a compound of a metal different from the metal in the nitride layers and the second layer of metal nitride underlies and contacts a copper layer of the copper interconnect.

14. The diffusion barrier of claim 13, wherein the compound of a metal different from the metal in the nitride layers is selected from the group consisting of an oxide of the reactive metal and a nitride of the reactive metal.

15. The diffusion barrier of claim 1, wherein the first layer of titanium nitride is deposited by atomic layer deposition (ALD).

16. A diffusion barrier for a copper interconnect that directly contacts and underlies a copper filler of the copper interconnect, the diffusion barrier comprising a first layer of titanium nitride directly contacting and covered by a layer of aluminum and a second layer of titanium nitride between the aluminum layer and the copper filler, wherein the grain boundaries of the first titanium nitride layer are stuffed with aluminum oxide.

17. The diffusion barrier of claim 1, wherein the layer of metal nitride comprises titanium nitride.

18. A diffusion barrier for a copper interconnect comprising a layer of metal nitride directly contacting and covered by a layer of silicon and a second layer of metal nitride directly contacting and over the layer of silicon, wherein the grain boundaries of the metal nitride layer are stuffed with silicon oxide and the diffusion barrier directly underlies a copper layer of the copper interconnect.

19. The diffusion barrier of claim 18, wherein the second layer of metal nitride comprises titanium nitride.

* * * * *